United States Patent [19]
Kwok

[11] Patent Number: 5,639,684
[45] Date of Patent: Jun. 17, 1997

[54] METHOD OF MAKING A LOW CAPACITANCE ANTIFUSE HAVING A PILLAR LOCATED BETWEEN THE FIRST AND SECOND METAL LAYERS

[75] Inventor: Siang Ping Kwok, Dallas, Tex.

[73] Assignee: Texas Instruments Incorporated, Dallas, Tex.

[21] Appl. No.: 476,960

[22] Filed: Jun. 7, 1995

Related U.S. Application Data

[62] Division of Ser. No. 178,185, Jan. 6, 1994, abandoned.

[51] Int. Cl.⁶ .................................................. H01L 21/70
[52] U.S. Cl. ............................ 437/60; 437/195; 437/922
[58] Field of Search ............................. 437/60, 190, 192, 437/246, 195, 922; 148/55; 257/50, 52, 530

[56] References Cited

U.S. PATENT DOCUMENTS

| | | | |
|---|---|---|---|
| 5,166,556 | 11/1992 | Hsu et al. | 437/922 |
| 5,248,632 | 9/1993 | Tung et al. | 437/922 |
| 5,329,153 | 7/1994 | Dixit | 257/530 |
| 5,369,054 | 11/1994 | Yen et al. | 437/195 |
| 5,373,169 | 12/1994 | McCollum et al. | 257/50 |
| 5,427,979 | 6/1995 | Chang | 437/190 |

FOREIGN PATENT DOCUMENTS

| | | | |
|---|---|---|---|
| 5243385 | 9/1993 | Japan | 437/922 |

*Primary Examiner*—Charles L. Bowers, Jr.
*Assistant Examiner*—Lynne A. Gurley
*Attorney, Agent, or Firm*—Gary C. Honeycutt; Rene E. Grossman; Richard L. Donaldson

[57] ABSTRACT

A low-capacitance antifuse (34 or 76) is provided for use in user-programmable integrated circuitry. The antifuse includes first (38 or 80) connection metal layers and second (54 or 94) connection metal layers. Between the metal layers is dielectric layer (52 or 82), and between the dielectric layer and at least one of the metal layers is a conductive layer in the form of pillar (40) or stack (81). The pillar or stack extends the separation between the metal layers thereby decreasing the capacitance of the antifuse.

5 Claims, 3 Drawing Sheets

5,639,684

METHOD OF MAKING A LOW CAPACITANCE ANTIFUSE HAVING A PILLAR LOCATED BETWEEN THE FIRST AND SECOND METAL LAYERS

This is a division of application Ser. No. 08/178,185 Jan. 5, 1994 now abandoned.

TECHNICAL FIELD OF THE INVENTION

The present invention relates generally to semiconductor devices and their fabrication and, more particularly, to an antifuse and method for manufacturing same using a conductive pillar.

BACKGROUND OF THE INVENTION

Conventional methods of fabricating integrated electronic circuits set all internal circuit connections during the manufacturing process. However, because of high development costs and high manufacturing tooling costs of such circuits, new designs are emerging that permit a user to configure or program integrated circuits for specific applications in the field after their purchase. Such circuits are called user-programmable circuits, and they permit a user to program the electrical connections of the circuit by either selectively opening or closing a series of programmable links. The programmable links are electrical interconnects that are electronically forced electrically open or closed at selectable nodes in the circuit by the user after the integrated circuit has been packaged.

An antifuse, which is one type of programmable link, permits a user to program the integrated circuit by creating a short between two conductors to which the original open antifuse connects. Antifuses consist typically of two conductor or semiconductor elements that have a dielectric or insulating material sandwiched between them. During programming, the dielectric is broken down at selected points between the conductive elements by a current developed from a predetermined programming voltage applied to the conductive elements of selected links. This electrically connects the conducting or semiconducting elements to the conductive elements.

One type of user programmable circuit known as a field programmable gate array (hereinafter FPGA) uses an interlayer of amorphous silicon (hereinafter α-Si) sandwiched between two metal layers. Refractory metals such as titanium tungsten (TiW), tungsten (W), or titanium nitride (TiN) are prime examples of the metals used to sandwich the α-Si.

Two previously developed antifuse structures include a via antifuse and a mesa antifuse. In a via antifuse, a layer of α-Si is deposited into a via formed in a dielectric. The α-Si contacts a metal layer at the bottom of the via with the metal layer forming the bottom of the antifuse or FBOT. Outwardly from the layer of α-Si in the via is deposited a second metal layer forming the top or FTOP of the antifuse. Previously developed via antifuses have the disadvantage of requiring the via to be relatively shallow, with a large opening so that a uniform α-Si layer can be formed in the via. A uniform or planarized α-Si antifuse layer is required to ensure that the breakdown voltage of the antifuse is uniform and to minimize leakage current from the antifuse. If the α-Si layer is nonuniform, then the breakdown voltage across a semiconductor device including multiple antifuses may be nonuniform making programming and use of the device very difficult.

Therefore, one approach to avoid non-uniform breakdown voltages and leakage currents in antifuses has been to make the vias shallow. Shallow via antifuses, however, require a thin interlayer oxide which results in high interconnect capacitance. As capacitance of the circuit increases, the speed of the circuit decreases. Therefore, shallow via antifuses have the disadvantage of resulting in slow circuits. Moreover, a thin interlayer oxide is susceptible to high electric-field breakdown.

Additionally, the need to put more antifuses in less area requires narrowing the via opening. Narrowing the via opening makes depositing a uniform layer of α-Si in the via more difficult. Depositing a uniform layer of α-Si in a narrow via is complicated by increasing the ratio of the distance between antifuse metal layers to the diameter of the via opening, i.e., the aspect ratio of the via antifuse.

FIG. 1 depicts the problems associated with depositing α-Si in a narrow deep via or via with a high aspect ratio. FIG. 1 includes a portion of via antifuse 10. Via antifuse 10 is formed from first multi-level oxide (MLO1) layer 12 with first barrier metal (MET1) layer 14 formed outwardly from MLO1 layer 12. Formed outwardly from MET1 layer 14 is second multi-level oxide (MLO2) layer 16 including via 18 formed therein. Deposited in via 18 is α-Si layer 20.

Via 18 of antifuse 10 of FIG. 1 has a high aspect ratio because the ratio of depth 22 to width 24 of via 18 is high. As the aspect ratio increases, the propensity for an uneven α-Si layer 20 on the bottom of the antifuse or FBOT 26 increases. FBOT 26 of antifuse 20 is shown with cusp 28 in α-Si layer 20 where the thickness of α-Si layer 20 at middle 30 is greater than at end points 32 of cusp 28. This nonuniformity in α-Si layer 20 results in a nonuniform breakdown voltage at which antifuse 10 is programmed and a nonuniform leakage current from antifuse 10. Therefore, as depth 22 increases and/or diameter 24 decreases for via 18, the propensity for cusping in antifuse 10 of FIG. 1 increases. This, in turn, results in a less reliable device.

Therefore, in previously developed via antifuses, a tradeoff is made between the uniformity of the α-Si layer and the interconnect capacitance of the antifuse. Also, via antifuses presently available are not scalable to accommodate decreasing design geometries.

A second type of antifuse structure presently practiced is the mesa or stack antifuse. In a mesa or stack antifuse, an FBOT metal layer is deposited outwardly from a first metal layer, and a layer of α-Si is deposited outwardly from the FBOT metal layer. An FTOP metal layer is then formed outwardly from the α-Si layer. The FTOP metal layer pattern is then formed and delineated by dry etching. A stack antifuse of a desired dimension is then patterned on the FTOP metal structure and formed by etching off the FTOP/α-Si/FBOT layers of the metal layer. A planarized MLO layer of a desired thickness is then formed over the stack antifuse structure. A via contact is then aligned to the antifuse and etched to expose the antifuse. A second metal layer (MET2) then connects the antifuse through the via contact hole.

In the stack antifuse structure, the alignment of the via contact requires that the antifuse dimension be enlarged to accommodate for the tolerance of alignment registration. This results not only in a higher antifuse capacitance, but also greatly limits the ability of the antifuses to be integrated into densely-packed semiconductor circuits.

SUMMARY OF THE INVENTION

A need exists, therefore, for an antifuse that has a uniform dielectric layer and low capacitance.

A further need exists for an antifuse that is scalable and self-aligning.

A need further exists for an antifuse that does not exhibit nonuniform leakage current and an irregular breakdown voltage.

An additional need exists for an antifuse that may be integrated into densely-packed integrated semiconductor circuits.

The present invention, accordingly provides a scalable and self-aligning antifuse that has a uniform dielectric layer, exhibits low capacitance and leakage current, and has a uniform breakdown voltage.

The present invention provides an antifuse for use in user-programmable integrated circuitry. The present antifuse has first and second connection metal layers for providing electricity to the antifuse. Between the metal layers is a dielectric layer, and between the dielectric layer and at least one of the metal layers is a conductive layer in the form of a pillar or stack. The pillar or stack extends the separation between the metal layers thereby decreasing the capacitance of the antifuse. More specifically, the pillar or stack comprises a layer or layers of a refractory metal. Also, the layers immediately contacting the dielectric layer may be planarized so that the dielectric layer is uniform.

A technical advantage of the present invention is that it provides an antifuse. The antifuse of the present invention is manufacturable by a repeatable process that results in planarized dielectric and metal layers in the antifuse. The antifuse of the present invention provides a technical advantage of having minimized capacitance.

An additional technical advantage of the antifuse of the present invention is its scalability. Scalability provides a technical advantage of allowing the dimensions of the present antifuse to be reduced so that it can be used in densely-packed integrated circuits.

Another technical advantage of the present invention is uniform leakage current due to the uniform dielectric layer in the antifuse. The uniform dielectric layer also eliminates nonuniform breakdown voltages that often result from conventional antifuses. The present antifuse also provides a technical advantage of being producible by repeatable manufacturing processes that result in high yields as compared to previously developed antifuse manufacturing techniques.

An additional technical advantage of the present invention is that it reduces the structurally induced defects in the dielectric layer and helps yield a more reliable antifuse for high speed FPGA and other user programmable integrated circuit applications. Because the antifuses that result from the process of the present invention are more reliable, the general reliability of integrated circuits improves. Since user programmable integrated circuit technologies are emerging, this improved reliability benefits this technology generally and makes it more applicable and acceptable for a variety of uses.

BRIEF DESCRIPTION OF THE DRAWINGS

The present invention is best understood by reference to the following detailed description of illustrative embodiments, when read with a view to the accompanying figures, wherein.

DETAILED DESCRIPTION OF THE INVENTION

The present invention can be understood more fully referring to the following detailed description of the invention when read together with the accompanying figures, wherein like numerals are used for like and corresponding parts.

Figure 1:
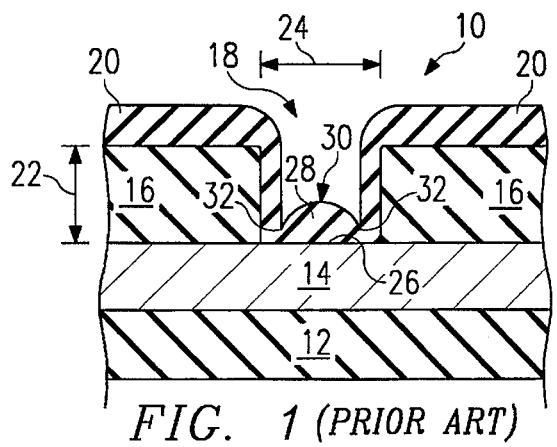
FIG. 1 depicts a cross-sectional view depicting cusping in a dielectric layer deposited in a high aspect ratio via.
Figure 2A:
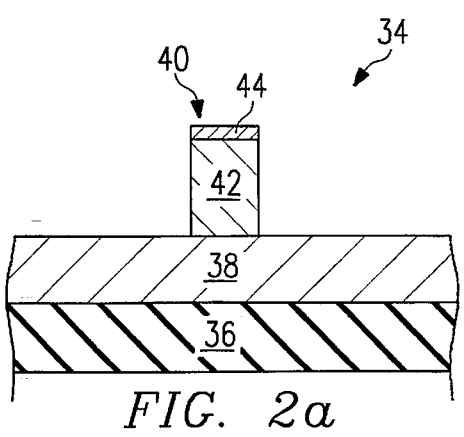
FIGS. 2a through 2g illustrate the formation of a pillar antifuse structure of the present invention.

FIG. 2a shows the beginning of an antifuse fabrication process flow used to illustrate certain aspects of the present antifuse. In FIG. 2a, antifuse 34 includes first multi-level oxide (MLO1) layer 36. MLO1 layer 36 is typically on the order of 5,000 to 7,000 Å. Formed outwardly from MLO1 layer 36 is a connection metal layer or first metal (MET1) layer 38 of antifuse 34. MET1 layer 38 typically comprises aluminum silicon copper (AlSiCu) or AlSiCu on titanium tungsten (TiW), with a thickness on the order of 4,000 to 5,000 Å and provides electricity to the antifuse.

A conductive layer or pillar 40 is formed outwardly from MET1 layer 38. In the embodiment depicted in FIGS. 2a–2g, pillar 40 includes TiW layer 42 formed outwardly from MET1 layer 38. Pillar 40 also includes Al or AlSiCu layer 44 formed outwardly from TiW layer 42. Pillar 40 may be formed, for example, by a three step process. First, a layer of TiW on the order of 5,000 Å is sputter deposited outwardly from MET1 layer 38, and a layer of Al on the order of 300 Å is sputter deposited outwardly from TiW layer 42. Second, the diameter of pillar 40 is defined with a photoresist pattern. Third, once the photoresist pattern has been defined, then pillar 40 can be formed by a reactive ion etch (RIE) or dry etch of Al layer 44 and TiW layer 42 using, for example, chlorinated gas and fluorinated gas respectively. The etching process is stopped once it reaches the top layer (AlSiCu) of MET1 layer 38, resulting in pillar 40 outwardly from MET1 layer 38 with TiW layer 42 on the order of 5,000 Å and Al or AlSiCu layer 44 on the order of 300 Å.

Figure 2B:
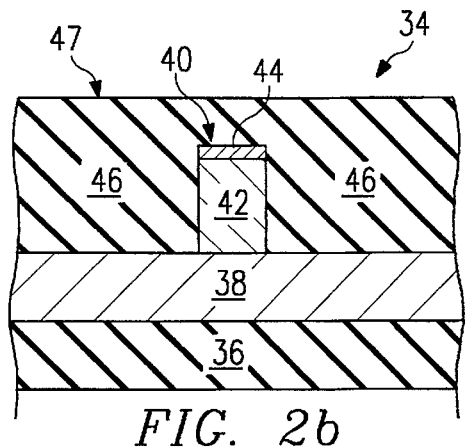

FIG. 2b shows the completion of the next steps in the antifuse formation process of the present invention. Formed outwardly from MET1 layer 38 is second multi-level oxide (MLO2) layer 46 comprising on the order of 10,000 Å of dielectric material. MLO2 layer 46 may be formed, for example, by spin on glass (SOG) techniques, or by, for example, plasma enhanced decomposition of tetraethyl orthosilicate (PTEOS). If MLO2 layer 46 is formed by PTEOS, then top surface 47 of MLO2 layer 46 may require planarization. Planarizing surface 47 can be accomplished by an etch back pattern resist technique which will be discussed in more detail in connection with FIGS. 3a–3d.

Figure 2C:
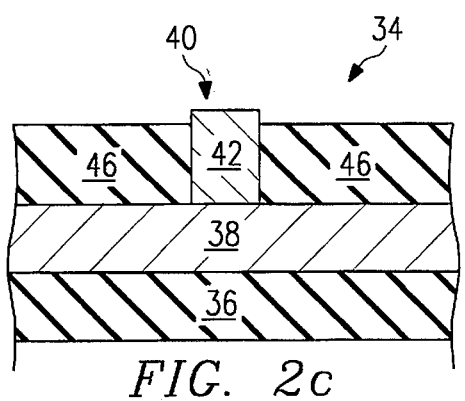

FIG. 2c shows the results of further processing in the formation of antifuse 34. Once MLO2 layer 46 has been planarized, if necessary, then pillar 40 may be exposed by, for example, a resist etch back. The presence of Al layer 44 prevents the etch back of pillar 40 during the removal of MLO2 layer 46. Al layer 44 may be important to protect TiW layer 42 from being unevenly etched during removal of MLO2 layer 46. Al layer 44 ensures that the top surface of pillar 42 remains smooth which is important in ensuring that the α-Si later deposited on the top of pillar 40 is smooth. Al layer 44 may also be a compound consisting of Al and a refractory metal. Once MLO2 layer 46 has been etched back to expose pillar 40, then Al layer 44 may be removed by, for example, a wet etch. The removal of Al layer 44 results in the structure of FIG. 2c.

Figure 2D:
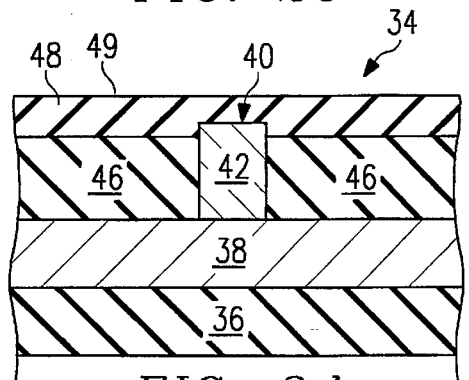

FIG. 2d shows the results following formation of third multi-level oxide (MLO3) layer 48 outwardly from MLO2 layer 46 and exposed pillar 40. MLO3 layer 48 may be formed by, for example, SOG or PTEOS. Again, forming MLO3 layer 48 via PTEOS may require planarizing top surface 49 of MLO3 layer 48 by etch back pattern resist, which will be further explained in connection with the discussions of FIGS. 3a through 3d. It is sufficient to state that following the completion of the deposition of MLO3 layer 48 that a structure similar to that depicted in FIG. 2d results.

Figure 2E:
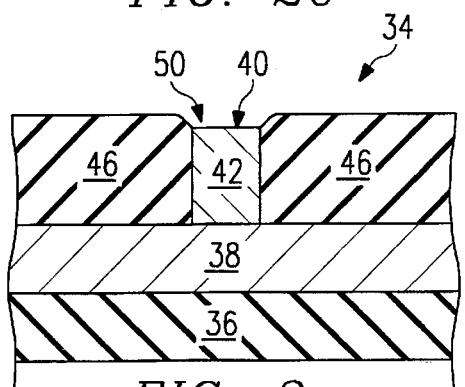

FIG. 2e shows the results following the next step of the method of manufacturing the antifuse of the present invention. By selectively etching MLO3 layer 48, MLO2 layer 46, and pillar 40, via 50 can be formed. A reactive ion etch back, for example, of MLO3 layer 48, MLO2 layer 46, and pillar 40, using an etch selectivity of 0.8 to 1.0 (MLO layers to pillar) results in an approximate 20% over etch of pillar 40 forming via 50. The etch selectivity of the MLO layers 48 and pillar 40 is important to the formation of via 50. It is noted that via 50 is a relatively shallow, low aspect ratio via.

Figure 2F:
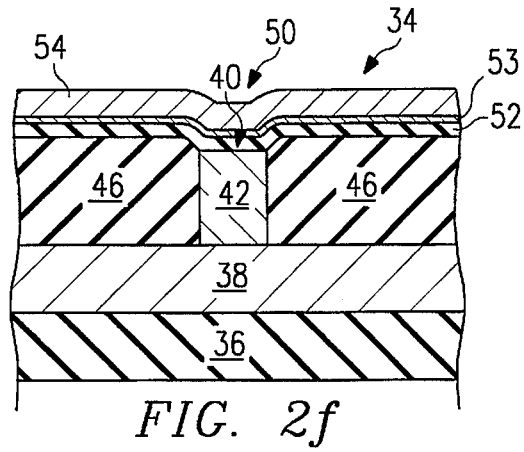

FIG. 2f shows the results of further steps in completing antifuse 34 of the present invention. Prior to depositing α-Si layer 52 on MLO2 layer 46 and pillar 40, the top surface of pillar 40 may be presputter cleaned. The top surface of pillar 40 may also be cleaned by the approach described in U.S. patent application Ser. No. (TI-17822) by S. P. Kwok and entitled, "Limited Metal Reaction for Contact Cleaning and Improved Metal-to-Metal Antifuse Contact Cleaning Method and Apparatus," and assigned to Texas Instruments Incorporated of Dallas, Tex. (hereinafter "Kwok"). For purposes of this use, the description of Kwok is incorporated by reference.

Following cleaning, dielectric layer 52 may be formed outwardly from MLO2 layer 46 and pillar 40. Dielectric layer 52 may be α-Si or compounds thereof, silicon nitride SiN or compounds thereof, or any other dielectric material suitable for forming an antifuse. Hereinafter, α-Si will be the dielectric material referred to, it being understood that other dielectric materials not specifically referred to, may be substituted for α-Si without departing from the inventive concepts of the present invention. Next, TiW layer 53 may be outwardly formed from α-Si layer 52. α-Si layer 52 is on the order of 1,000 to 2,000 Å and TiW layer 53 is on the order of 1,000 to 3,000 Å. A second connection metal layer or second metal (MET2) layer 54 is then formed outwardly from TiW layer 53. MET2 layer 54 may be, for example, AlSiCu on the order of 4,000 to 5,000 Å.

Figure 2G:
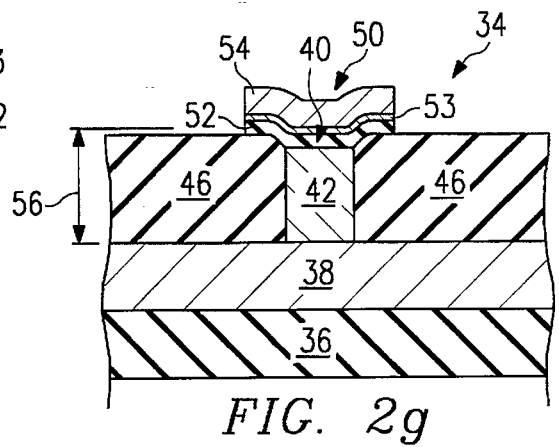

FIG. 2g shows the results of the final processing steps of the antifuse of the present invention. In FIG. 2g the shape of α-Si layer 52, TiW layer 53, and MET2 layer 54 can be defined through photoresist masking and etching. MET2 layer 54 may be etch backed using, for example, a chlorinated gas that stops at TiW layer 53. Then by, for example, etching with fluorinated gas TiW layer 53 and α-Si layer 52, antifuse structure 34 of FIG. 2g is completed.

The formation of antifuse 34 of FIGS. 2a through 2g provides numerous technical advantages. The distance between MET1 layer 38 and MET2 layer 54 has been increased over shallow via structures by the conductive layer or pillar 40. Antifuse 34 may, therefore, be referred to as an extended antifuse. Increasing the distance between MET1 layer 38 and MET2 layer 54 decreases the interconnect capacitance C between MET1 and MET2 layers by the well known formula for capacitance:

$$C = \frac{\epsilon A}{d}$$

where:

$\epsilon$ is the permittivity of the dielectric of the capacitor.
A is the area of the conductors; and
d is the distance between the conductors.
Therefore, increasing the distance between MET1 layer 38 and MET2 layer 54 increases the denominator in the formula for capacitance, thereby decreasing the host interconnect capacitance of antifuse 34. This provides the technical advantage of a low capacitance antifuse.

Additionally, the results of etch selectivity depicted in FIG. 2e show that the formation of via 50 over pillar 40 is formed by a self-aligning process. This eliminates the need for additional masking steps in order to define the location of via 50 over pillar 40.

Because via 50 is a shallow via, α-Si layer 52 is a uniform planarized layer not prone to cusping. Uniform α-Si layer 52 provides antifuse 34 with a uniform breakdown voltage and leakage current. Uniform α-Si layer 52 also reduces the structurally induced defects in α-Si 52. This, in turn, makes a circuit into which antifuse 34 is integrated into a more reliable device.

The process described in the formation of antifuse 34 can be used to form multiple antifuses in an integrated semiconductor circuit. Each of the antifuses has the same uniform α-Si layer resulting in a uniform breakdown voltage for the antifuses. A uniform breakdown voltage for the multiple antifuses increases the programming yield of the antifuses. Also, because the present antifuse has a uniform α-Si layer in a shallow via, it can be manufactured by repeatable processing techniques resulting in high yields.

Also, antifuse 34 is scalable. The diameter of pillar 40 can be reduced by appropriate masking techniques prior to etching to the desired dimension. This gives antifuse 34 a technical advantage of being integratable into denselypacked semiconductor circuits.

The processing steps described in conjunction with the formation of antifuse 34 of FIGS. 2a–2g are exemplary only. Many semiconductor processing techniques, as are well known in the art, may be used in forming antifuse 34 without departing from the inventive concepts of the present invention.

In order to form the self-aligning shallow vias of the present antifuse, it is important that the surface to be selectively etched be planarized, i.e., smooth. Selective etching of the planarized surface, in turn, results in the formation of the shallow vias. When PTEOS is used to form the MLO layers in the present antifuse, the PTEOS MLO layer must be planarized before it is etched to form the vias.

Figure 3A:
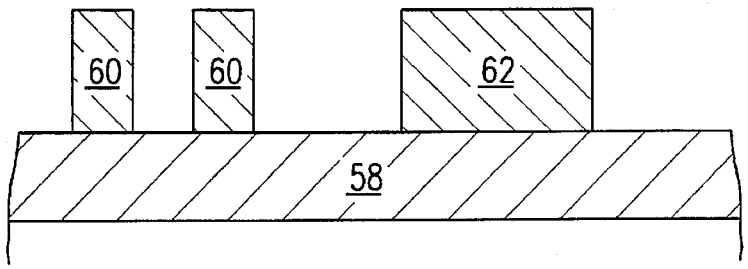
FIGS. 3a through 3d illustrate an etch back pattern resist technique for planarizing the layers of an antifuse structure.

FIGS. 3a through 3d depict an etch back pattern resist technique used for planarizing the levels of the present antifuse. FIG. 3a shows MET1 layer 58 with narrow pillars 60 formed outwardly from MET1 layer 58 and wide pillar 62 formed outwardly from MET1 layer 58. Pillars 60 and 62 of FIG. 3a may be formed as described in connection with the formation of pillar 40 in FIG. 2a.

Figure 3B:
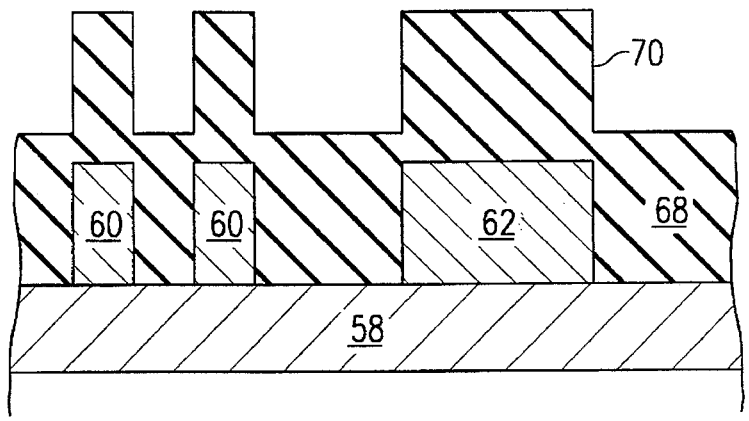

FIG. 3b shows the results of further processing in accordance with the present etch back pattern resist technique. MLO layer 68 has been deposited outwardly from MET1 layer 58 and pillars 60 and 62. Due to the irregular contour presented by the pillars, irregular surface 70 results on MLO layer 68. An etch back of MLO layer 68 would probably not result in the shallow vias desired in the present antifuse as depicted in FIG. 2e.

Figure 3C:
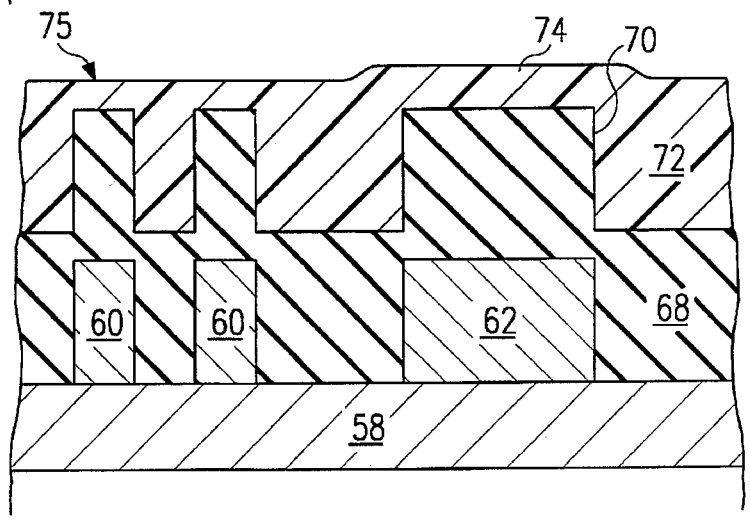

FIG. 3c shows the results following the deposition of photoresist layer 72 on surface 70 of MLO layer 68. Again, because of the uneven contour of surface 70 of MLO layer 68, bump 74 above pillar 62 can result in surface 76 of photoresist layer 72. While an etch back of surface 76 of photoresist layer 72 depicted in FIG. 3c should result in the desirable shallow vias for pillars 60, the same cannot be said for pillar 62. Therefore, a selective pattern etch back of photoresist layer 72 may be used to remove bump 74 from surface 75.

Figure 3D:
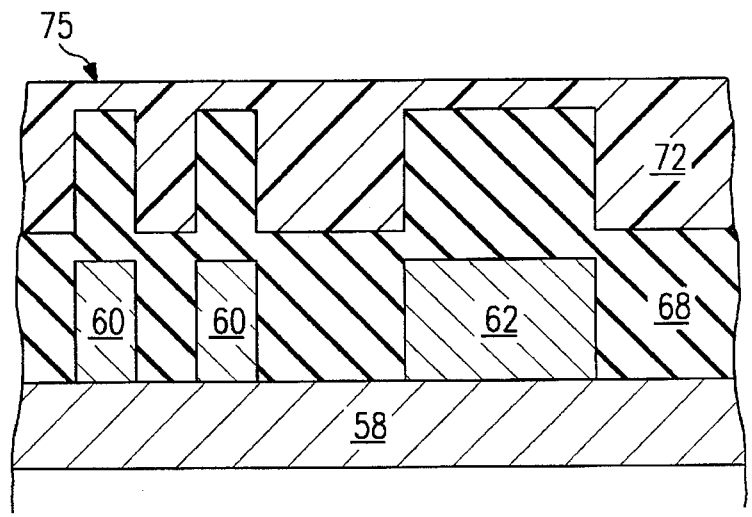

FIG. 3d shows the results of the selective pattern etch back of surface 75 resulting in uniform surface 75. The combined layers of photoresist layer 72, MLO layer 68, pillars 60, and pillar 62 are then ready for etch back as described in connection with FIG. 2e. Selective pattern etch back will result in the formation of shallow vias on pillars 60 and pillar 62.

The method depicted in FIGS. 3a–3d provides a technical advantage of providing a planarized surface for etch back. This smooth planarized surface is desirable to provide a shallow via with a smooth fuse bottom that is desirable in forming a smooth α-Si antifuse layer.

Figure 4A:
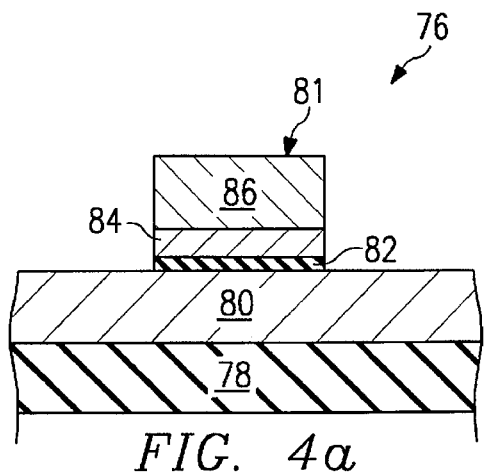
FIGS. 4a through 4e show the formation of a stacked antifuse structure of the present invention.

FIGS. 4a through 4e depict an alternative embodiment of the present antifuse. FIG. 4a shows the results of steps in forming a stacked antifuse of the present invention. Stacked antifuse 76 begins with first MLO1 layer 78 on the order of 5,000 to 7,000 Å. Formed outwardly from MLO1 layer 78 is MET1 layer 80. MET1 layer 80 may be typically, for example, on the order of 3,000 Å of TiW on 4,500 Å of AlSiCu. Formed outwardly from MET1 layer 80 is stack 81. A conductive layer or stack 81 may be, for example, α-Si layer 82, TiW layer 84, and Al or AlSiCu layer 86. Stack 81 is formed by depositing α-Si layer 82 outwardly from MET1 layer 80. Next, TiW layer 84 is formed outwardly from α-Si layer 82, and Al layer 86 is formed outwardly from TiW layer 84. The layers of stack 81 are generally on the order of 1,000 Å of α-Si, 2,000 Å of TiW, and 5,000 Å of Al.

Once the layers of stack 81 are deposited on MET1 layer 80, the pattern of stack 81 is defined with resist and the unnecessary Al, TiW, and α-Si are removed by, for example, dry etching. This removal results in pillar 81 of the desired diameter formed outwardly from MET1 layer 80. A chlorinated reactive RIE may be used, for example, to etch Al layer 86 and α-Si layer 82, and TiW layer 84 may be formed by, for example, a fluorinated RIE.

Figure 4B:
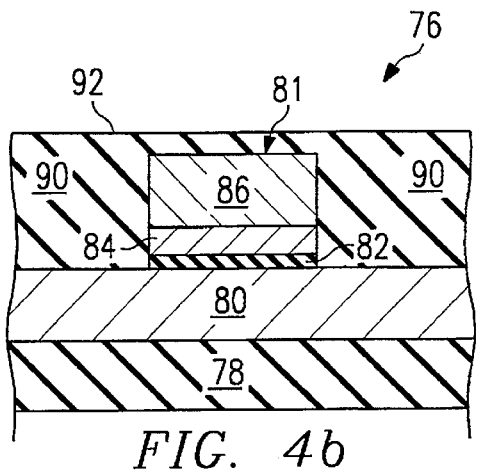

FIG. 4b shows the results following additional processing steps of stacked antifuse 76. MLO2 layer 90 has been formed outwardly from MET1 layer 80 and stack 81. The thickness of MLO2 layer 90 may be on the order of 10,000 Å. MLO2 layer 90 may be formed by SOG or PTEOS or their combination. A PTEOS MLO2 layer 90 may be planarized as described in connection with discussions of FIGS. 3a through 3d, resulting in planarized top surface 92.

Figure 4C:
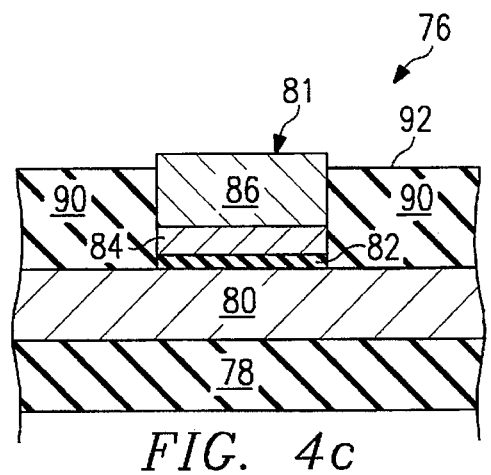

FIG. 4c shows the results of additional processing steps in the formation of stacked antifuse 76 of the present invention. By selectively etching back MLO2 layer 90, pillar 81 may be exposed.

Figure 4D:
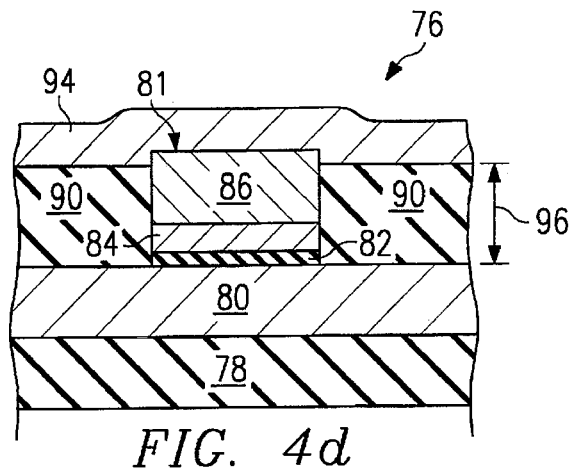

FIG. 4d shows the results of additional processing steps in the formation of the present stacked antifuse. MET2 layer 94 may be deposited on MLO2 layer 90. MET2 layer 94 may be on the order of 4,000 to 5,000 Å of, for example, AlSiCu.

Figure 4E:
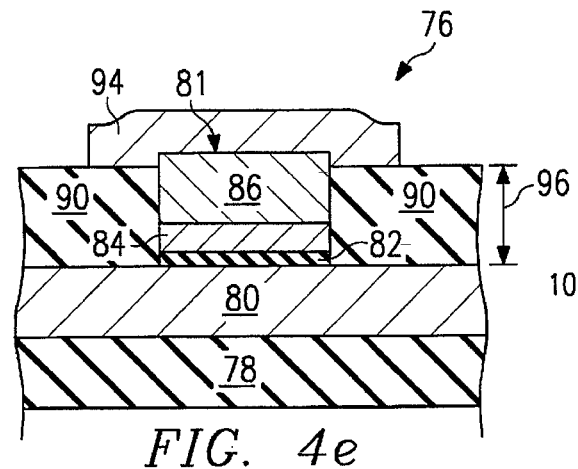

FIG. 4e shows the results of additional processing steps where MET2 layer 94 is further limited by removing a portion of the metal layer, thereby defining stacked antifuse 76.

Stacked antifuse structure 76 depicted in FIG. 4d and 4f has the same technical advantages as that identified for antifuse 34 of FIG. 2g. The distance 96 between MET1 layer 80 and MET2 layer 94 has been increased over previously developed MESA or stack antifuses by including stack 81 so that the capacitance in antifuse 76 has been reduced.

Figure 5:
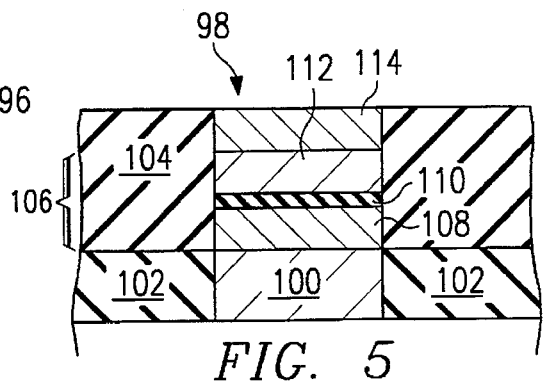
FIG. 5 depicts a cross-sectional view of a multilevel stacked antifuse structure of the present invention.

FIG. 5 depicts double stacked antifuse 98 employing the techniques of the present invention. Double stacked antifuse 98 includes MET1 layer 100 and MLO1 layer 102. Formed outwardly from MET1 layer 100 and in MLO2 layer 104 is double stack 106. Double stack 106 includes TiW layer 108 formed outwardly from MET1 layer 100, α-Si layer 110 formed outwardly from TiW layer 108, second TiW layer 112 formed outwardly from α-Si layer 110, and Al layer 114 formed outwardly from TiW layer 112. Including both TiW layers 108 and 112 gives antifuse 98 its double stacked structure. The layers included in double stack antifuse 98 may be formed as previously described for stacked antifuse 76 of FIGS. 4a–4e. The dimensions of double stack 106 may be defined through appropriate masking and etching of the layers in double stack 106. Additionally, it is noted that MLO1 layer 102 and MLO2 layer 104 can be combined into a single MLO layer.

The bottom of TiW layer 108 adjacent to MET1 layer 100 forms the bottom of antifuse 98, and the top of Al layer 114 forms the top of antifuse 98. Both the top and bottom of the antifuse may be planarized using the standard techniques such as the etch back pattern resist technique described in connection with FIGS. 3a–3d or chemical-mechanical polishing.

The antifuses of the present invention may have many compositions and it is not intended that they be limited to those shown in the figures. The conductive layer and layers may be comprised of numerous refractory metals and compounds thereof, including, for example, Ti, TiN, WN molybdenum (Mo), and W. The term refractory metal hereinafter refers to refractory metals and compounds thereof. Numerous combinations of α-Si, TiW, Al, and AlSiCu layers may be used to create multi-level conductive layer stacks or pillars so as to extend the distance between metal layers within the antifuse within the inventive concepts of the present invention.

The present antifuse uses conductive layers in the form of pillars or stacks to extend the distance between connection metal layers to provide a low capacitance antifuse. In the pillar embodiment of the present antifuse, the distance between metal layers can be extended and yet still provide a uniform α-Si layer in a via between the metal layer. This provides technical advantages of uniform breakdown voltage and leakage current for the present antifuse. The stacked embodiment of the present antifuse also extends the distance between metal layers thereby minimizing interconnect capacitance. The present antifuse is scalable allowing for shrinking its geometries so that it may be integrated into densely-packed semiconductor circuits.

Although the invention has been described with reference to the above-specified embodiments, this description is not meant to be construed in a limiting sense. Various modifications in the disclosed embodiment, as well as alternative embodiments of the invention will become apparent to persons skilled in the art upon reference to the above description. It is, therefore, contemplated that the appended claims will cover such modifications that fall within the true scope of the invention.

What is claimed is:

1. A method for forming an antifuse for use in user-programmable integrated circuitry, comprising the steps of:

forming a first connection metal layer on a first dielectric layer;

forming a conductive pillar on said first connection metal layer and directly over said first dielectric layer, whereby said conductive pillar is narrower than said first connection metal layer;

forming a second dielectric layer on said first connection metal layer, surrounding said conductive pillar, such that the top of said conductive pillar remains exposed;

forming and patterning a layer of antifuse material on said second dielectric layer, in contact with the exposed portion of the conductive pillar; and forming and patterning a second connection metal layer, on said antifuse material;

whereby the separation between said first and second connection metal layers is increased, in order to decrease the capacitance of the device.

2. A method as in claim 1, wherein said first connection metal layer has a uniform thickness of 4,000 to 5,000 Angstroms.

3. A method as in claim 2, wherein said second dielectric layer has a uniform thickness of at least 10,000 Angstroms.

4. A method as in claim 3, wherein said antifuse material has a uniform thickness of about 1,000 to 2,000 Angstroms.

5. A method as in claim 4, wherein said second connection metal layer has a uniform thickness of about 4,000 to 5,000 Angstroms.

* * * * *